(12) United States Patent
Dyott

(10) Patent No.: US 6,594,020 B2
(45) Date of Patent: Jul. 15, 2003

(54) METHOD FOR CONTROLLING FIBER OPTIC SENSOR SCALE FACTOR USING AMPLITUDE MODULATION

(75) Inventor: Richard B. Dyott, Oak Lawn, IL (US)

(73) Assignee: KVH Industries, Inc, Middletown, RI (US)

(*) Notice: Subject to any disclaimer, the term of this patent is extended or adjusted under 35 U.S.C. 154(b) by 0 days.

(21) Appl. No.: 09/906,019

(22) Filed: Jul. 13, 2001

(65) Prior Publication Data
US 2002/0025098 A1 Feb. 28, 2002

Related U.S. Application Data

(60) Provisional application No. 60/218,086, filed on Jul. 13, 2000.

(51) Int. Cl.$^7$ .............................................. G01C 19/72
(52) U.S. Cl. ...................................................... 356/460
(58) Field of Search ................................ 356/464, 460, 356/463; 385/12, 14

(56) References Cited

U.S. PATENT DOCUMENTS

| | | |
|---|---|---|
| 4,571,650 A | 2/1986 | Ojima et al. |
| 4,603,931 A | 8/1986 | Ruffman |
| 4,615,582 A | 10/1986 | Lefevre et al. |
| 4,630,229 A | 12/1986 | D'Hondt |
| 4,630,890 A | 12/1986 | Ashkin et al. |
| 4,637,722 A | 1/1987 | Kim ............................ 356/350 |
| 4,668,264 A | 5/1987 | Dyott |
| 4,669,814 A | 6/1987 | Dyott ....................... 350/96.15 |
| 4,697,876 A | 10/1987 | Dyott |
| 4,712,866 A | 12/1987 | Dyott |
| 4,733,938 A | 3/1988 | Lefevre et al. |
| 4,740,085 A | 4/1988 | Lim ............................ 356/350 |
| 4,755,021 A | 7/1988 | Dyott |
| 4,756,589 A | 7/1988 | Bricheno et al. |
| 4,765,739 A | 8/1988 | Koizumi et al. |

(List continued on next page.)

FOREIGN PATENT DOCUMENTS

| | | |
|---|---|---|
| DE | 33 05 104 A1 | 8/1984 |
| DE | 36 15 305 A1 | 11/1987 |
| DE | 37 42 201 A1 | 6/1989 |
| EP | 0 551 874 A2 | 7/1993 |
| EP | 0 586 242 A1 | 3/1994 |

(List continued on next page.)

OTHER PUBLICATIONS

US 6,208,775, 3/2001, Dyott (withdrawn)
Alekseev et al; "Fiber Optic Gyroscope With Suppression of Excess Noise From the Radiation Source", Technical Physical Letters, 24(9): 719–721, (September 1998).
Blake et al., "In–Line Sagnac Interferometer Current Sensor," *IEEE*, pp. 116–121 (1995).
Blake and Szafraniec, "Random Noise in PM and Depolarized Fiber Gyros", OSA Symposium Proceedings, 1997, OWB2, pp. 122–125.
Bohnert. et al., "Field Test of Interferometric Optical Fiber High–Voltage and Current Sensors" *SPIE,* vol. 2360 pp. 16–19 (Feb. 1994).

(List continued on next page.)

*Primary Examiner*—Stephone Allen
(74) *Attorney, Agent, or Firm*—Foley Hoag, LLP

(57) ABSTRACT

A system and a method for controlling the scale factor of a fiber optic sensor are disclosed. The scale factor may be maintained at a constant level by controlling the power level of the light source based on the amplitude of a modulation superimposed on the modulator drive signal. Alternatively, scale factor may be maintained at a constant level by setting the detected signal at twice the modulator drive frequency to zero.

13 Claims, 3 Drawing Sheets

U.S. PATENT DOCUMENTS

| | | | |
|---|---|---|---|
| 4,776,700 A | 10/1988 | Frigo | |
| 4,796,993 A | 1/1989 | Sonobe et al. | |
| 4,815,817 A | 3/1989 | Levinson | |
| 4,842,409 A | 6/1989 | Arditty et al. | |
| 4,848,910 A | 7/1989 | Dupraz | |
| 4,883,358 A | 11/1989 | Okada | |
| 4,887,900 A | 12/1989 | Hall | 356/350 |
| 4,943,132 A | 7/1990 | Huang | |
| 5,033,854 A | 7/1991 | Matthews et al. | |
| 5,048,962 A | 9/1991 | Kurokawa et al. | |
| 5,063,290 A | 11/1991 | Kersey | |
| 5,074,665 A | 12/1991 | Huang et al. | |
| 5,080,489 A | 1/1992 | Nishikawa et al. | |
| 5,096,312 A | 3/1992 | Huang | |
| 5,106,193 A | 4/1992 | Fesler et al. | |
| 5,133,600 A | 7/1992 | Schröder | |
| 5,135,555 A | 8/1992 | Coyle, Jr. et al. | |
| 5,136,235 A | 8/1992 | Brandle et al. | |
| 5,289,257 A | 2/1994 | Kurokawa et al. | |
| 5,289,258 A | 2/1994 | Szafraniec et al. | 356/350 |
| 5,331,404 A | 7/1994 | Moeller et al. | |
| 5,351,123 A | 9/1994 | Spahlinger | 356/350 |
| 5,359,413 A | 10/1994 | Chang et al. | |
| 5,365,338 A | 11/1994 | Bramson | 356/350 |
| 5,406,370 A | 4/1995 | Huang et al. | |
| 5,412,471 A | 5/1995 | Tada et al. | |
| 5,459,575 A | 10/1995 | Malvern | |
| 5,469,257 A | 11/1995 | Blake et al. | |
| 5,469,267 A | 11/1995 | Wang | |
| 5,471,301 A | 11/1995 | Kumagai et al. | |
| 5,493,396 A | 2/1996 | Sewell | |
| 5,500,909 A | 3/1996 | Meier | |
| 5,504,684 A | 4/1996 | Lau et al. | |
| 5,552,887 A | 9/1996 | Dyott | 356/350 |
| 5,559,908 A | 9/1996 | August et al. | 385/12 |
| 5,602,642 A | 2/1997 | Bergh et al. | |
| 5,644,397 A | 7/1997 | Blake | |
| 5,654,906 A | 8/1997 | Youngquist | |
| 5,655,035 A | 8/1997 | Burmenko | |
| 5,682,241 A | 10/1997 | Mark et al. | |
| 5,701,177 A | 12/1997 | Kumagai et al. | |
| 5,701,376 A | 12/1997 | Shirasaki | |
| 5,767,509 A | 6/1998 | Cordova et al. | |
| 5,781,675 A | 7/1998 | Tseng et al. | |
| 5,854,864 A | 12/1998 | Knoesen et al. | |
| 5,898,496 A | 4/1999 | Huang et al. | |
| 5,946,097 A | 8/1999 | Sanders et al. | |
| 5,949,545 A * | 9/1999 | Lo et al. | 549/65 |
| 5,953,121 A | 9/1999 | Bohnert et al. | |
| 5,953,122 A * | 9/1999 | Ecke et al. | 356/460 |
| 5,987,195 A | 11/1999 | Blake | |
| 6,023,331 A | 2/2000 | Blake et al. | |
| 6,025,915 A | 2/2000 | Michal et al. | 356/350 |
| 6,028,668 A * | 2/2000 | Rider | 356/460 |
| 6,047,095 A | 4/2000 | Knoesen et al. | |
| 6,075,915 A | 6/2000 | Koops et al. | |
| 6,148,131 A | 11/2000 | Geertman | |
| 6,163,632 A | 12/2000 | Rickman et al. | |
| 6,185,033 B1 | 2/2001 | Bosc et al. | |
| 6,233,371 B1 | 5/2001 | Kim et al. | |
| 6,301,400 B1 | 10/2001 | Sanders | |
| 6,351,310 B1 | 2/2002 | Emge et al. | |
| 6,370,289 B1 | 4/2002 | Bennett | |
| 6,389,185 B1 | 5/2002 | Meise et al. | |
| 6,396,965 B1 | 5/2002 | Anderson | |

FOREIGN PATENT DOCUMENTS

| | | |
|---|---|---|
| EP | 0 686 867 A1 | 12/1995 |
| EP | 0 722 081 A2 | 7/1996 |
| EP | 856 737 A1 | 8/1998 |
| EP | 0 871 009 A1 | 10/1998 |
| EP | 0 872 756 A1 | 10/1998 |
| FR | 2 535 463 A | 5/1984 |
| JP | 07209398 | 8/1995 |
| WO | WO98/58268 A | 12/1998 |
| WO | WO00/31551 | 6/2000 |
| WO | WO00/36425 | 6/2000 |

OTHER PUBLICATIONS

Bohnert. et al., "Temperature and Vibration Insensitive Fiber–Optic Current Sensor" *ABB*, vol. 2360 pp 336–339 (Feb. 1994).

Burns, et al., "Excess Noise in Fiber Gyroscope Sources", IEEE Photonics Technology Letter, vol. 2, No. 8, Aug. 1990, pp. 606–608.

Clark et al., "Application of a PLL and ALL Noise Reduction Process in Optical Sensing System," *IEEE Translations on Industrial Electronics*, vol. 44, No. 1, Feb. 1997, pp. 136–138.

Dagenais et al., "Low–Frequency Intensity Noise Reduction for Fiber–Optic Sensor Applications," *Optical Fiber Sensors Conference*, 1992, Jan. 29–31, 1992, pp. 177–180.

Dupraz, J.P., "Fiber–Optic Interferometers for Current Measurement: Principles and Technology", Alsthom Review No. 9: 29–44 (Dec. 1987).

Frosio, G. and Dändliker, "Reciprocal Reflection Interferometer for a Fiber–Optic Faraday Current Sensor", Applied Optics 33 (25): 6111–6122 (Sep. 1, 1994).

Gronau Yuval et al.; "Digital Signal Processing for an Open–Loop Fiber–Optic Gyroscope", Applied Optics, Optical Society of America, Washington, U.S., vol. 34, No. 25, Sep. 1, 1995, pp. 5849–5853.

Killian M. Kevin; "Pointing Grade Fiber Optic Gyroscope", IEEE AES Systems Magazine, pp. 6–10 (Jul. 1994).

Lefevre, "The Fiber–Optic Gyroscope", Artech House, Boston, pp. 29–30 (1993).

McCallion and Shimazu; "Side–Polished Fiber Provides Functionality and Transparency", Laser Focus World, 34 (9): S19–S24, (Sep. 1, 1998).

Moeller and Burns, "1.06 μm All–fiber Gyroscope with Noise Subtraction, Proceedings of the Conference on Optical Fiber Sensors", IEEE–OSA, Monterey, CA, 1992, pp. 82–85.

Moeller and Burns, "Observation of Thermal Noise in a Dynamically Biased Fiber–Optic Gyro", Optical Letters, 1996, vol. 21, pp. 171–173.

Polynkin et al.; "All–Optical Noise–Subtraction Scheme for a Fiber–Optic Gyroscope", Optics Letters, 25(3): 147–149, (Feb. 1, 2000).

Rabelo et al.; "SNR Enhancement of Intensity Noise–Limited FOGs", Journal of Lightwave Technology 18(12):2146–2150 (Dec. 2000).

Short, S. et al., "Elimination of Birefringence Induced Scale Factor Errors in the In–Line Sagnac Interferometer Current Sensor", Journal of Lightwave Technology 16 (10): 1844–1850 (Oct. 1998).

Ross, J.N., "The Rotation of the Polarization in Low Birefringence Monomode Optical Fibres Due to Geometrical Effects," Optical and Quantum Electronics 16: 455–461 (Oct. 1984).

LaViolette and Bossler: "Phase Modulation Control for An Interferometric Fiber Optic Gyroscope",IEEE Plan 90, Position Location and Navigation Symposium, Las Vegas, (Mar. 20–23, 1990).

Ono et al.; "A Small–Sized, Compact, Open–loop Fibre–Optic Gyroscope with Stabilized Scale Factor", Meas. Sci. Technol. 1: 1078–1083, 1990.

International Search Report Completed on Jan. 24, 2002 and Mailed on Feb. 1, 2002.

* cited by examiner

METHOD FOR CONTROLLING FIBER OPTIC SENSOR SCALE FACTOR USING AMPLITUDE MODULATION

RELATED APPLICATIONS

This application claims priority to, and incorporates by reference, the entire disclosure of U.S. Provisional Patent Application No. 60/218,086 filed on Jul. 13, 2000.

FIELD OF THE INVENTION

The invention is directed to fiber optic sensors, and more particularly to controlling the scale factor of fiber optic sensors, such as gyroscopes and current sensors.

BACKGROUND OF THE INVENTION

Interferometric fiber optic sensors have found extensive use in the art and may include Fiber Optic Gyroscopes (FOG)s and Fiber Optic Current sensors (FOC)s. In general, light emitted from a suitable light source may pass through a polarizer and is split by a coupler into two approximately equal intensity, counter-propagating beams which traverse the sensor coil. The two light beams exiting the coil may then recombine at the coupler, where they may interfere as a result of a phase shift between the counter-propagating beams. In FOGs, the phase shift results from rotation of the sensor coil. In FOCs, a $\lambda/4$ waveplate may be placed near each end of sensor coil, and the phase shift results from the magnetic field of a current carrying conductor passing through the sensor coil. The recombined light beam may then pass through the polarizer a second time in the opposite direction, and half of the light may be directed to a photodetector by a second coupler. The phase shift detected is related to the rotation rate in the case of a FOG, or to the electric current within the conductor in the case of a FOC, by a scale factor.

FOGs may be operated as a "closed loop" or "open loop" system. An open loop fiber optic sensor, such as an open loop FOG, has the advantage of simplicity and low cost compared to a closed loop configuration. On the other hand, closed loop FOGs have the advantage of excellent bias stability, linearity and scale factor stability, although some of these characteristics require thermal modeling on an individual unit basis. However, closed loop FOGs require a wide bandwidth modulator device, while the open loop FOG requires only a single frequency modulator. Conversely, the open loop gyroscope has a sinusoidal response to rotation, and the scale factor is dependent on both the optical intensity at the detector and the modulation depth. These considerations have limited the performance of most open loop gyroscopes.

The theory of open loop gyroscopes is known in the art. The direction of rotation can be determined and the sensitivity optimized by applying a phase modulation at a frequency $f_m$ to the light propagating in the fiber optic sensing coil by means of a piezoelectric transducer. Alternatively, other methods of modulating the phase difference, for example, using an electro-optic material such as lithium niobate and/or non-linear polymers, may be employed. The Sagnac interferometer converts this modulation into a detected output signal represented by a series of Bessel functions corresponding to harmonics of the phase modulation frequency $f_m$. The odd harmonics are proportional to the sine of the rotation rate, while the even harmonics are proportional to the cosine of the rotation rate. All of the information required to determine the rotation rate and to linearize and stabilize the scale factor can be extracted from the signal at the fundamental phase modulation frequency and the signals at a limited number of the harmonic frequencies.

Conventional FOG systems process the signal in analog form, which represents an approximation of an analytic approach. A FOG can be operated with a low Sagnac scale factor by using a short length coil and restricting the maximum input rate. The operating regime is selected to be near the zero of the sine function at the fundamental phase modulation frequency. For a small modulation depth, the sine function can be approximated by a straight line. The amplitude of the second harmonic of the phase modulation frequency is then at the peak of a cosine function and consequently varies very little with rotation rate. The peak value of the second harmonic can then be used as a measure of the detected signal intensity to control and maintain the light source power over time and operating temperature. Thus, by appropriately selecting the modulation depth to minimize the sensitivity of the second harmonic to rotation, the PZT can be operated at approximately the same modulation depth over a range of temperature. With these design criteria, analog signal processing can provide a rate sensor with excellent performance. However, controlling the scale factor over an extended period of time and a wide range of operating temperatures by using the level of the second harmonic signal alone is a challenge for analog processing electronics.

It would therefore be desirable to provide an analog signal processing system and method for a fiber optic sensor that improves the environmental and temporal stability of the sensor scale factor.

SUMMARY OF THE INVENTION

The invention is directed to an analog signal processing system for fiber optic sensors. In particular, the digital signal processing system described herein can be used to stabilize the sensor scale factor. The fiber optic sensor coil can measure physical quantities, such as a rotation rate or a magnetic field. In one aspect, the present invention provides a method of controlling the scale factor of a fiber optic sensor comprising amplitude modulating the signal driving a phase modulator in a fiber optic sensor, and using the component of the detected signal at the amplitude modulation frequency to control the laser power in the sensor. As will be apparent in the following discussion, this method has the advantage of stabilizing the scale factor and minimizing the component of the detected signal at twice the amplitude modulation frequency. In another aspect, the present invention provides a method of controlling the scale factor my maximizing the component of the detected signal at the amplitude modulation frequency. In still another aspect, the present invention provides a fiber optic sensor in which the scale factor is stabilized by using the component of the detected signal at the amplitude modulation frequency to control the power level of an optical source.

Further features and advantages of the present invention will be apparent from the following description of preferred embodiments and from the claims.

BRIEF DESCRIPTION OF THE DRAWINGS

The following figures depict certain illustrative embodiments of the invention in which like reference numerals refer to like elements. These depicted embodiments are to be understood as illustrative of the invention and not as limiting in any way.

DETAILED DESCRIPTION OF CERTAIN ILLUSTRATED EMBODIMENTS

The invention is directed to an analog signal processing system for fiber optic sensors. In particular, the digital signal processing system described herein may be used to stabilize the sensor scale factor. The fiber optic sensor coil may measure physical quantities, such as a rotation rate or a magnetic field.

Figure 1:
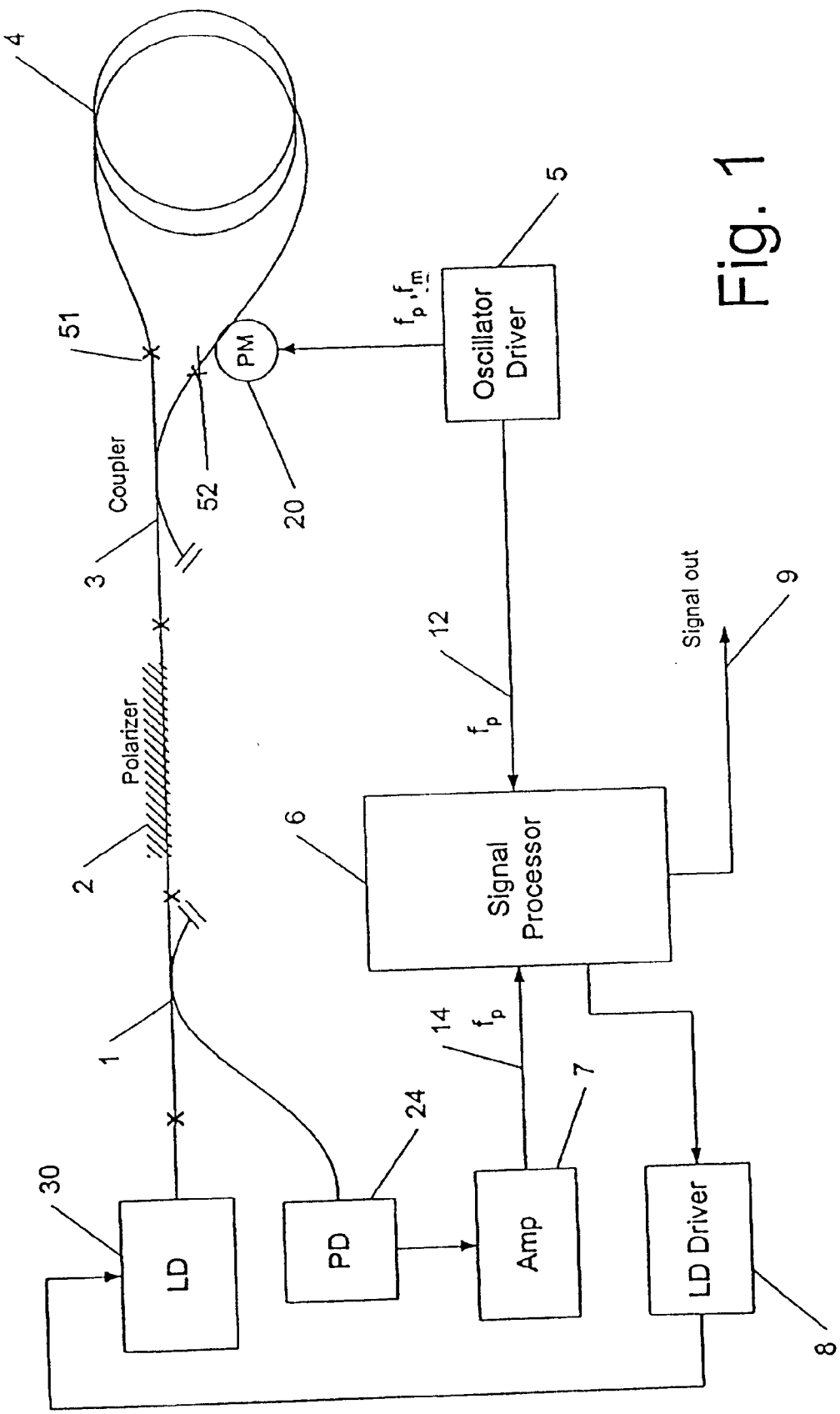
FIG. 1 is a schematic diagram of a fiber optic sensor.

FIG. 1 illustrates a conventional interferometric fiber optic sensor. Light emitted from a suitable light source 30 may pass through a first 3 dB coupler 1 where half of the light may be dissipated, and half may be sent into the interferometer through the polarizer 2. A second 3 dB coupler 3 may then split the light into two approximately equal intensity, counter-propagating beams which traverse the coil. The two light beams exiting the coil may then recombine at the second coupler 3 where they may interfere. The recombined light beam may then pass through the polarizer 2 a second time in the opposite direction, and half of the light may be directed to the photodetector 24 by the first coupler 1. An optical splitting ratio of 3 dB may typically be selected for the couplers to maximize the optical power incident on the detector. In some embodiments, other splitting ratios may also be selected for the first and second couplers. A magnetic field sensor, which may be used to sense an electric current, operates according to the same principle with the addition of two $\lambda/4$ waveplates 51, 52 that may be placed near the sensor coil ends.

A piezo-electric transducer (PZT) 20 may be used to modulate the phase difference between the two counter-propagating light beams. Other methods of modulating the phase difference, for example, electro-optic material such as lithium niobate or non-linear polymers may also be employed. This phase modulation may serve two purposes. The modulation may dynamically bias the interferometer to a more sensitive operating point and may also allow the determination of rotation sense. Further, if the phase modulation is varying, it may move the detected signal from direct current (DC) to alternating current (AC) in order to improve the accuracy of the electrical signal processing. With sinusoidal phase modulation, the interferometer output signal may be an infinite series of sine and cosine waveforms whose amplitudes are proportional to Bessel functions evaluated at the phase modulation depth. As will be discussed in greater detail below, the ratios of the fundamental and several of the lowest order harmonic signal amplitudes may be used to detect rotation rate and/or magnetic field, while at the same time maintaining a stable, linear output scale factor. The light source and modulator may be controlled via drivers 5, 8 by analog and/or digital electronic hardware 6 which may receive input signals from detector 24 via amplifier 7.

Alternatively, the fiber optic sensor may also have a reduced minimum configuration (RMC) as disclosed, for example, in the pending U.S. patent application No. 09/459,438 and the concurrently filed U.S. application entitled "Reduced minimum configuration fiber optic current sensor" to Sidney Bennett (Atty. Docket No. KVC-019.03 and now U.S. Pat. No. 6,351,310 B1), both of which are commonly assigned to the assignee of the present application and are incorporated herein by reference.

As noted previously for open loop FOGs, the scale factor is the coefficient that relates the measured signal to the rotation rate. The scale factor may be dependent on both the optical intensity (optical power from the light source) at the detector, and the modulation depth $\phi$ (also known as the modulation index). When the measured signal is at the phase modulation frequency $f_m$, the scale factor may be proportional to $J_1(\phi)$, because the signal component at $f_m$ is proportional to $J_1(\phi)$. Further, when the second harmonic of the phase modulation frequency (the signal component at $2f_m$) is used to control the laser output power as described above, the scale factor may be inversely proportional to $J_2(\phi)$. Then the scale factor (SF) may be written as $$SF=k\{J_1(\phi)/J_2(\phi)\} \qquad \text{Eq. (1)}$$

where k is a constant, dependent on the fiber optic sensor configuration and not affected by environmental conditions; and $\phi$ is the phase modulation depth.

A large variation in the scale factor with the modulation depth may be introduced by a large value of the derivative $d\{J_2(\phi)\}/d\phi$. Experiments have shown that controlling the optical power level of the light source 30 by using the level of the second harmonic signal (the signal component at $2f_m$) may increase the percentage change in scale factor by more than an order of magnitude at high rotation rates, making the sensor scale factor extremely unstable. For this reason, while the second harmonic is commonly used to control the optical power level, it is somewhat unsatisfactory.

The methods outlined below aim to reduce this change by using an alternative method of stabilizing of the optical power from the light source. A frequency source, such as the oscillator/driver 5 or another oscillator (not shown), which may operate at a frequency $f_p$, may be used to modulate the amplitude of the modulator drive voltage, producing an amplitude modulation of the phase modulation depth $\phi$. As a result, sensor signals at the fundamental frequency and the harmonic frequencies of the PZT modulation frequency $f_m$ are also amplitude-modulated at the frequency $f_p$. It thus follows that the amplitude levels of these signals are proportional to the Bessel functions $J_0(\phi), J_1(\phi), J_2(\phi) \ldots J_n(\phi)$. The level of the DC component is proportional to $J_0(\phi)$, so that the amplitude of the superimposed modulation at $f_p$ is proportional to the slope of $J_0(\phi)$, i.e., $J_0'(\phi)$. Based on Bessel function relationships, $J_0'(\phi)=-J_1(\phi)$. $J_0(\phi)$ is the first derivative of $J_0(\phi)$ with respect to $\phi$ and has an extreme at $\phi=1.84$ radians, which is the operating point for maximum sensor sensitivity. Hence, the level of the signal component $f_p$ at the detector 24 may be maximized so that the level of the PZT drive 5 may be set at a modulation depth of $\phi=1.84$ radians.

The modulation amplitude at $f_p$ may be used to control the light source drive and thereby the optical power of the light emitted by the light source 30 to stabilize the sensor scale factor. In an embodiment of the present invention, the power level of the light source 30 is controlled by $J'_0(\phi)$, instead of $J_2(\phi)$, so that $$SF=k'\{J_1(\phi)/J_0'(\phi)\}, \qquad \text{Eq. (2)}$$

where k' is a constant which may differ from k in Eq. (1). Since $J_0'(\phi)=-J_1(\phi)$, it follows that $SF=-k'=$constant.

In other words, the scale factor may become independent of variations in the modulation depth when the signal amplitude at the amplitude modulation frequency $f_p$ is used to control the light source drive and thereby the optical power of the light emitted by the light source.

In one embodiment, the system of the present invention may operate by comparing the signal 14 obtained from the detector at $f_p$ with a signal 12 derived directly from the modulator, thereby removing fluctuations in the oscillating amplitude at frequency $f_p$. The resultant signal may be used to stabilize the drive of the light source, as described above.

It is noted that the PZT may have a relatively slow response to amplitude modulation because of a relatively high Q-value of the disk. Thus, to effectively modulate the amplitude of the PZT drive voltage, the modulated signal may have a frequency limit of, for example, 1 kHz. However, a modulation at such a low-frequency $f_p$ may nevertheless amplitude modulate the sensor output signal. Further, the amplitude modulation of the PZT drive at a low-frequency $f_p$(<1 kHz) may not only produce a signal at the detector at the frequency $f_p$ with a level proportional to $J_0'(\phi)$, but also a second harmonic at the frequency $2f_p$. Because this second harmonic's amplitude is proportional to $J_2(\phi)$, and mathematically $J_2(\phi)$ is proportional to $J_1'(\phi)$, the amplitude is zero at $\phi$=1.84 radians. Thus, in an alternative embodiment, the modulation index $\phi$ may be kept at its optimal level by a feedback loop which keeps the amplitude of the second harmonic (the signal component measured at the detector at twice the amplitude modulation frequency, $2f_p$) equal to zero.

It may therefore be possible to stabilize the sensor scale factor by controlling the power level via maximizing the amplitude of the signal component at $f_p$, using $J_0'(\phi)$, and the modulation depth $\phi$ via the zero of $2*f_p$. There may no longer be a need to detect the second and fourth harmonics of the phase modulation frequency $f_m$, making the scale factor virtually constant over time and a wide temperature range.

An embodiment of the invention may have the additional advantage that the second harmonic signal with its cosine dependence on the Sagnac phase angle $\Theta$ need no longer be used. This advantageously may produce a $\sin\Theta/\Theta$ response of the fiber optic sensor, rather than the $\tan\Theta/\Theta$ response obtained with conventional systems, thereby greatly improving the dynamic range.

Experiments using a commercial sensor (model "Northfinder" from KVH Industries, Inc.) have demonstrated to that it may be possible to set the PZT drive voltage to approximately one part in 1000 by using an embodiment of the invention as disclosed.

Figure 2:
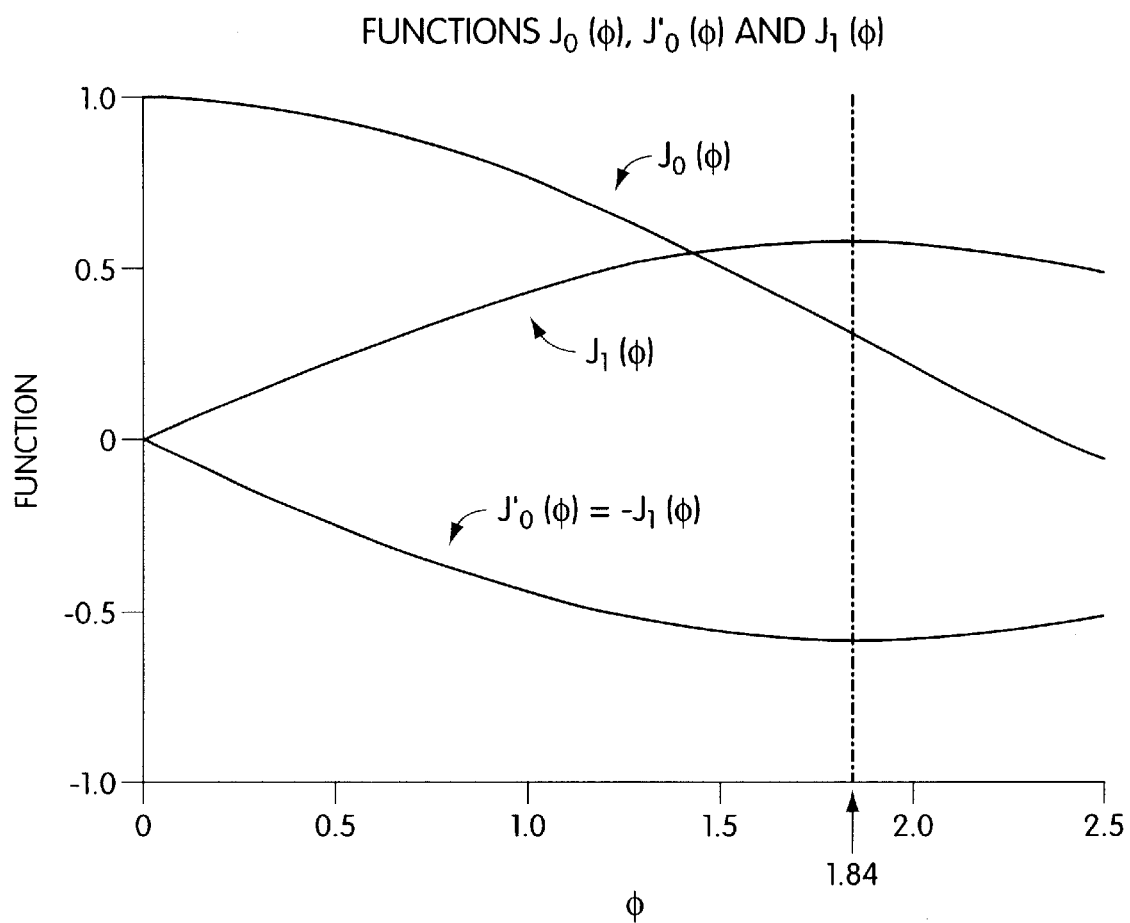
FIG. 2 shows the amplitude of the $0^{th}$ order Bessel functions $J_0(\phi)$, the derivative $-J_0'(\phi)$ of the $0^{th}$ order Bessel functions $J_0(\phi)$, and the $1^{st}$ order Bessel function $J_1(\phi)$.

FIG. 2 shows the amplitude of the $0^{th}$ order Bessel functions $J_0(\phi)$, the derivative $-J_0'(\phi)$ of the $0^{th}$ order Bessel functions $J_0(\phi)$, and the $1^{st}$ order Bessel function $J_1(\phi)$. For the embodiments previously described, only the fundamental and the first harmonic frequency are required to characterize the fiber optic sensor scale factor.

Figure 3:
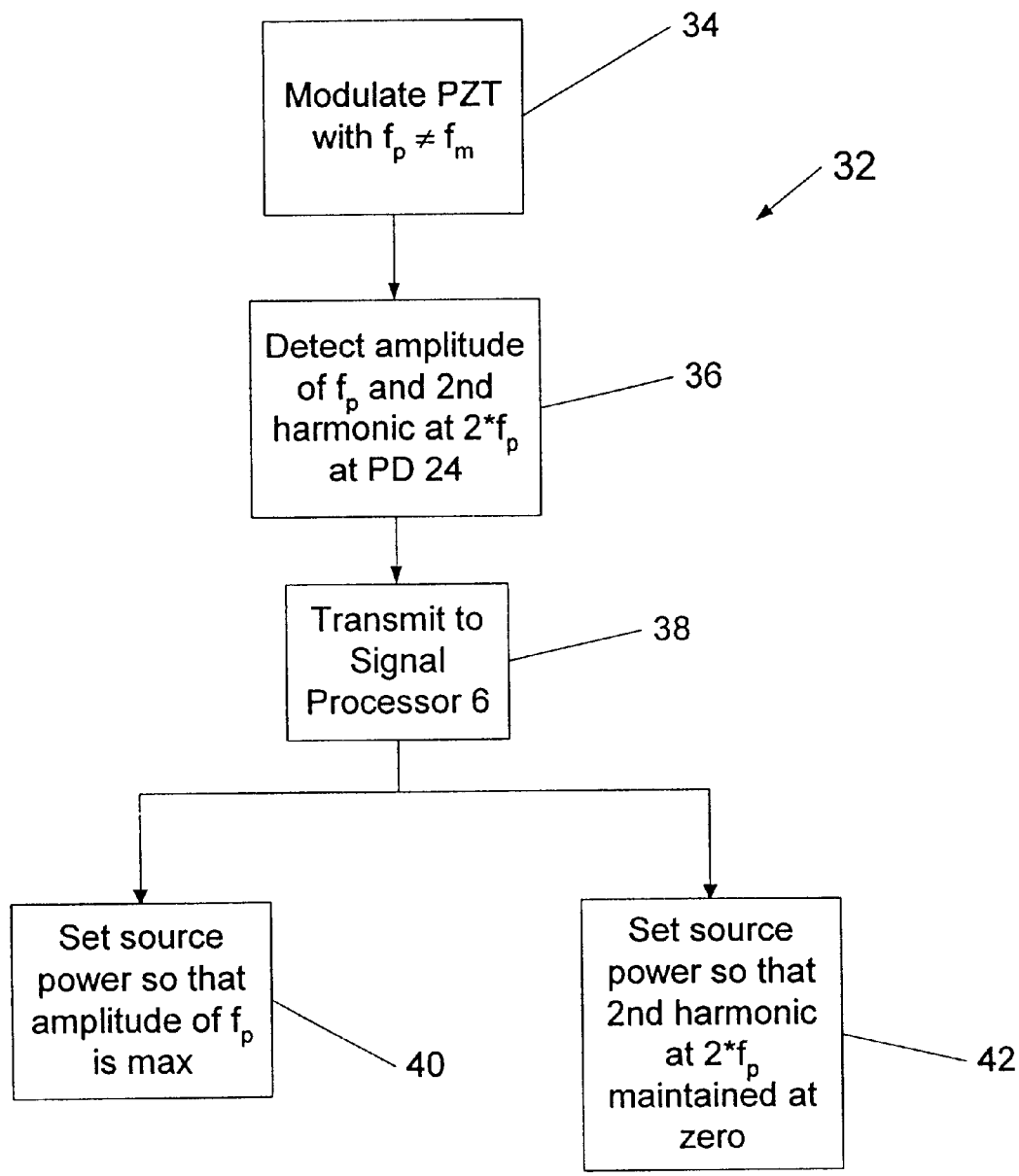
FIG. 3 is a flow chart of a process according to the invention for analog stabilization of the sensor scale factor.

Referring now to FIGS. 1 and 3, in a process 32 for controlling the scale factor of a fiber optic sensor, the PZT modulator 20 of FIG. 1 may be modulated by a modulation frequency $f_p$ in addition to the PZT drive frequency $f_m$, step 34. For obvious reasons, $f_p$ is selected to be different from $f_m$. Photodetector 24 of FIG. 1 may detect at step 36, in the manner as previously described, the amplitude of the superimposed modulation $f_p$ and a second harmonic at the frequency $2*f_p$, which may be transmitted to signal processor 6 of FIG. 1 at step 38. In one embodiment, signal processor 6 may control the power source 30 of FIG. 1 via the LD driver 8 of FIG. 1, such that the amplitude of the superimposed modulation $f_p$ measured at the detector may be maintained at a maximum. Alternatively or in addition, the signal processor 6 may control the power source 30 via LD driver 8, such that the signal component at the frequency $2*f_p$ may be maintained at a zero amplitude. Both embodiments are seen to maintain the scale factor of the fiber optic sensor with great accuracy.

While the invention has been disclosed in connection with the preferred embodiments shown and described in detail, various modifications and improvements thereon will become readily apparent to those skilled in the art. For example, the aforedescribed signal processing may also be applied to fiber optic current sensors, such as the minimum configuration (MC) and reduced minimum configuration (RMC) current sensor described in the copending U.S. patent application No. 09/459,438, which is incorporated herein by reference. Accordingly, the spirit and scope of the present invention is to be limited only by the following claims.

What is claimed is:

1. A method of controlling a scale factor of a fiber optic sensor, comprising:

(a) driving a phase modulator of the fiber optic sensor with a modulation drive at a frequency $f_m$;

(b) amplitude modulating the modulation drive at an amplitude modulation frequency $f_p$;

(c) detecting at a photodetector a return signal from the fiber optic sensor; and (d) setting a power level of an optical source supplying optical power to the fiber optic sensor so that a component of the return signal is maintained at one of a maximum and a null value.

2. The method of claim 1, where setting the power level of the optical source further comprises maintaining the component of the return signal at the amplitude modulation frequency $f_p$ at the maximum value.

3. The method of claim 2, where setting the power level of the optical source further comprises using a signal processor to set the power level of the optical source.

4. The method of claim 3, where detecting the return signal further comprises feeding the return signal from the photodetector to an amplifier and from the amplifier to the signal processor.

5. The method of claim 4, where setting the power level of the optical source further comprises the signal processor controlling the power level by feeding to a driver for the optical source a control signal dependent on an amplitude of the component of the return signal at the amplitude modulation frequency $f_p$, the control signal varying to maintain the amplitude at the maximum value.

6. The method of claim 1, where setting the power level of the optical source further comprises maintaining an amplitude of the component of the return signal at twice the amplitude modulation frequency $f_p$ at a null value.

7. The method of claim 6, where setting the power level of the optical source further comprises using a signal processor to set the power level of the optical source.

8. The method of claim 7, where detecting the return signal further comprises feeding the return signal from the photodetector to an amplifier and from the amplifier to the signal processor.

9. The method of claim 8, where setting the power level of the optical source further comprises the signal processor controlling the power level by feeding to a driver for the optical source a control signal dependent on the amplitude of the component of the return signal at twice the amplitude modulation frequency $f_p$, the control signal varying to maintain the amplitude at the null value.

10. A fiber optic sensor comprising:

an optical source;

a phase modulator driven with a modulation drive at a frequency $f_m$ the modulation drive amplitude modulated at an amplitude modulation frequency $f_p$;

a photodetector detecting a return signal from the sensor; and a signal processor controlling a power level of the optical source so that an amplitude of a component of the return signal at the amplitude modulation frequency $f_p$ is maintained at a maximum value.

11. The fiber optic sensor of claim 10, further comprising a driver for the optical source, wherein a control signal sent from the signal processor to the driver for the optical source varies dependent on the amplitude of the component of the return signal at the amplitude modulation frequency $f_p$.

12. A fiber optic sensor comprising:

an optical source;

a phase modulator driven with a modulation drive at a frequency $f_m$ the modulation drive amplitude modulated at an amplitude modulation frequency $f_p$;

a photodetector detecting a return signal from the sensor; and a signal processor controlling a power level of the optical source so that an amplitude of a component of the return signal at twice the amplitude modulation frequency $f_p$ is maintained at a null value.

13. The fiber optic sensor of claim 12, further comprising a driver for the optical source, wherein a control signal sent from the signal processor to the driver for the optical source varies dependent on the amplitude of the component of the return signal at the amplitude modulation frequency $f_p$.

* * * * *